(12) United States Patent
Schricker et al.

(10) Patent No.: US 11,994,437 B2
(45) Date of Patent: May 28, 2024

(54) PIEZOELECTRIC DEVICE HAVING AT LEAST ONE PIEZOELECTRIC ELEMENT

(71) Applicant: PIEZOCRYST ADVANCED SENSORICS GMBH, Graz (AT)

(72) Inventors: Alexander Schricker, Graz (AT); Christian Neubauer, Graz (AT); Andreas Mayer, Lieboch (AT)

(73) Assignee: PIEZOCRYST ADVANCED SENSORICS GMBH, Graz (AT)

( * ) Notice: Subject to any disclaimer, the term of this patent is extended or adjusted under 35 U.S.C. 154(b) by 1121 days.

(21) Appl. No.: 16/637,336

(22) PCT Filed: Aug. 7, 2018

(86) PCT No.: PCT/AT2018/060182
§ 371 (c)(1),
(2) Date: Feb. 7, 2020

(87) PCT Pub. No.: WO2019/028488
PCT Pub. Date: Feb. 14, 2019

(65) Prior Publication Data
US 2023/0194368 A1    Jun. 22, 2023

(30) Foreign Application Priority Data
Aug. 7, 2017    (AT) .................................. 50656/2017

(51) Int. Cl.
| G01L 1/26 | (2006.01) |
| C04B 35/583 | (2006.01) |
| G01L 1/16 | (2006.01) |
| G01L 9/00 | (2006.01) |
| G01L 19/04 | (2006.01) |
| G01P 15/09 | (2006.01) |

(Continued)

(52) U.S. Cl.
CPC .............. *G01L 1/26* (2013.01); *C04B 35/583* (2013.01); *G01L 1/16* (2013.01); *G01L 9/008* (2013.01);
(Continued)

(58) Field of Classification Search
CPC ... G01L 1/26; G01L 1/16; G01L 9/008; G01L 19/04; H10N 30/8561; H10N 30/302;
(Continued)

(56) References Cited

U.S. PATENT DOCUMENTS 2,988,728 A    6/1961    Marlow
3,727,084 A *    4/1973    Epstein ............... G01P 15/0915
310/329

(Continued)

FOREIGN PATENT DOCUMENTS

AT    371255 B    6/1983
DE    19651227 A1 *    6/1997    ............... G01L 1/16
(Continued)

*Primary Examiner* — Octavia Davis Hollington
(74) *Attorney, Agent, or Firm* — Dykema Gossett PLLC

(57) ABSTRACT

Aspects of the present disclosure relate to a piezoelectric device having at least one piezoelectric element, which has a support plane oriented to a force introduction element, wherein in the event of a thermal loading of the piezoelectric device in the support plane, expansion differences between the piezoelectric element and the force introduction element occur. To compensate for shear loadings, at least one transition element is arranged between the piezoelectric element and the force introduction element, the E-module of which is smaller than the E-module of the piezoelectric element in the support plane.

19 Claims, 4 Drawing Sheets

(51) Int. Cl.
*H10N 30/30* (2023.01)
*H10N 30/853* (2023.01)
*H10N 30/88* (2023.01)

(52) U.S. Cl.
CPC .............. *G01L 19/04* (2013.01); *G01P 15/09* (2013.01); *H10N 30/302* (2023.02); *H10N 30/8561* (2023.02); *H10N 30/886* (2023.02); *C04B 2235/3244* (2013.01); *C04B 2235/3409* (2013.01); *C04B 2235/3418* (2013.01); *C04B 2235/3826* (2013.01); *C04B 2235/386* (2013.01); *C04B 2235/428* (2013.01); *C04B 2235/767* (2013.01)

(58) Field of Classification Search
CPC ................ G10N 30/886; C04B 35/583; C04B 2235/3244; C04B 2235/3409; C04B 2235/3418; C04B 2235/3826; C04B 2235/386; C04B 2235/428; C04B 2235/767; G01P 15/09
See application file for complete search history.

(56) References Cited

U.S. PATENT DOCUMENTS

| | | | | |
|---|---|---|---|---|
| 4,052,628 | A | | 10/1977 | Hayer |
| 4,359,658 | A | * | 11/1982 | Cartier ................ G01P 15/0907 310/329 |
| 4,802,371 | A | * | 2/1989 | Calderara ................. G01L 1/16 73/862.68 |
| 5,834,653 | A | | 11/1998 | Glaser |
| 8,113,058 | B2 | * | 2/2012 | Baumgartner .......... G01L 9/008 361/283.1 |
| 11,644,373 | B2 | * | 5/2023 | Campbell ............... G01L 5/167 73/774 |
| 2012/0204644 | A1 | * | 8/2012 | Varak ..................... H10N 30/88 29/25.35 |

FOREIGN PATENT DOCUMENTS

| | | |
|---|---|---|
| DE | 10217164 A1 | 11/2002 |
| JP | 859216028 S | 12/1984 |

\* cited by examiner

PIEZOELECTRIC DEVICE HAVING AT LEAST ONE PIEZOELECTRIC ELEMENT

CROSS-REFERENCE TO RELATED APPLICATIONS

This application is a national stage filing based upon International application No. PCT/AT2018/060182, filed Aug. 7, 2018, which claims the benefit of priority to Austria application No. A 50656/2017, filed Aug. 7, 2017.

BACKGROUND

The invention relates to a piezoelectric device having at least one piezoelectric element which has a support plane aligned with a force introduction element, wherein expansion differences between the piezoelectric element and the force introduction element occur when the piezoelectric device is thermally loaded in the support plane.

With force measuring elements, pressure sensors, acceleration and shear force sensors that have piezoelectric crystal elements, one property of these materials becomes negatively apparent, namely expansion differences to adjacent materials under thermal load, as well as the anisotropy of some material values, such as thermal expansion or transverse expansion under mechanical stress.

The actual piezoelectric measuring element practically always adjoins a housing, a support, a compression die or a force introduction element, wherein a thermal expansion behavior or anisotropies of a comparable size are hardly to be found in these components as in many of the piezo-crystals in question. Especially in the transition region from the anisotropic crystal element to the isotropic support, harmful shear forces and shear stresses therefore occur. On the one hand, this can cause the crystal element to crack during heating due to the greater elongation of the support material. On the other hand, the crystal element slips over the support along the crystal direction with greater elongation and the crystal element is subsequently cracked during cooling.

During heating or cooling under compressive load or pretension, frictional sliding of the components on each other or strong tensions of both the support and the measuring element occur, since isotropic and anisotropic material can at best be strain-matched in one direction. Up to now, the material of a thrust piece or support has usually been selected in such a way that its coefficient of thermal expansion, as well as its coefficient of lateral expansion, lies between the respective extreme values of the crystal element—measured in the plane of the contact surface—so that in this way a certain limitation of the stresses or sliding processes could be achieved.

The stresses caused by the anisotropy and the different thermal expansion behavior can lead to the destruction of the support or the piezoelectric crystal element, the latter especially in the case of disc-shaped measuring elements arranged in stacks with several measuring elements, as used in the utilization of the so-called longitudinal Piezo-effect (charge reduction occurs in the pressure surface). The frictional forces applied via the support or contact surfaces act here on a cross-section of the crystal elements that is relatively small in relation to these forces, which can lead to breakage of the measuring elements under alternating thermal loads.

Furthermore, the charge output of the crystal, i.e. the measuring signal, is also influenced by the tension of the crystal. For example, frictional sliding can occur in parts of the pressure surface between the crystal element and the support, resulting in hysteresis phenomena in the measurement signal, which of course must be avoided.

In connection with this problem, DE 196 51 227 A1 proposes to divide the piezoelectric measuring element or the end regions of both supports facing the piezoelectric measuring element into several rod-, roller- or web-shaped elements, wherein the two supports and the piezoelectric measuring element have essentially the same thermal expansion or transverse expansion in the longitudinal direction of the rod-, roller- or web-shaped elements normal to the direction of force application. These problems are eliminated or minimized by an "anisotropic design" of the measuring element or the support.

For example, the end regions of both supports facing the piezoelectric measuring element are made of an isotropic material and have web-shaped elements or rollers whose thermal and transverse expansion in the longitudinal direction is matched to that of the piezoelectric measuring element. However, the production of such end areas is complex and the adjustment of thermal and transverse expansion in the longitudinal direction is not possible for many material combinations.

Another approach is described in DE 102 17 164 B4. For better adaptation of the thermal expansion in the area of the contact surfaces, an adaptation element is arranged on both sides of the piezoelectric element (e.g. made of $GaPO_4$) in an intermediate layer to the respective supporting element. Each of the adaptation elements (e.g. also made of $GaPO_4$) exhibits an anisotropic thermal expansion at least in the plane of its two contact surfaces, which lies in the direction of the maximum expansion differences (for example in the direction of the z-axis of the piezoelectric element) between that of the piezoelectric element and the isotropic supporting element.

The compensation of the different thermal expansion is achieved, for example, by means of adaptation elements whose optical z-axis is tilted by a certain angle with respect to the contact surfaces or rotated around the y-axis. The thermal expansion in the direction of the projection (projection of the z-axis onto the contact surface) lies between that of the piezoelectric element in the direction of the z-axis and that of the isotropic support. Furthermore, the projection of the optical z-axis of the adaptation element is parallel or antiparallel to the optical z-axis of the piezoelectric element.

However, this approach is costly and cannot always be implemented successfully, especially since the prevailing opinion has been that the support must be designed as hard as possible. Typical materials for the support have so far been nickel-based materials or insulating ceramics (e.g. $Al_2O_3$) or sapphire.

SUMMARY OF THE INVENTION

It is the object of the present invention to improve the piezoelectric devices described above in such a way that shear stresses and shear forces in the areas between the force introduction elements and the piezoelectric measuring element are minimized or largely avoided with the simplest possible measures. Furthermore, the quality of the measurement signal is to be improved, wherein in particular spontaneously occurring false signals caused by frictional sliding and slipping of the piezoelectric elements on their supports are to be avoided.

According to the invention, this is achieved by arranging at least one transition element between the piezoelectric element and the force introduction element, the modulus of elasticity of which is smaller than the modulus of elasticity of the piezoelectric element in the support plane thereof. This causes the piezoelectric element to "stretch" or "compress" the transition element. Therefore, the voltage values in the piezoelectric element are reduced, which could damage or tear the piezoelectric element.

In accordance with the invention, in a piezoelectric device in which the at least one piezoelectric element has an anisotropic thermal expansion and an anisotropic modulus of elasticity which can be described by an elasticity tensor $E^K$, the modulus of elasticity of the transition element is smaller than the components $c_{22}$ and $c_{33}$ of the elasticity tensor $E^K$ which are assigned to the support plane.

If the transition material, for example a sintered body, also has an anisotropic modulus of elasticity which can be described by an elasticity tensor $E^U$, with $$E^K = \begin{bmatrix} c_{11} & & \\ & c_{22} & \\ & & c_{33} \end{bmatrix} E^0 = \begin{bmatrix} c_{11} & & \\ & c_{22} & \\ & & c_{33} \end{bmatrix}$$

then $$c_{22}(E^K) > c_{22}(E^0) \text{ and } c_{33}(E^K) > c_{33}(E^0)$$

applies. The component $c_{11}$ of the elasticity tensor concerns a direction (x-direction) normal to the support plane (y-z-plane) and has no influence on the expansion differences in the support plane.

In order to transmit the compressive forces into the piezoelectric element with as little loss as possible, the transition element has a compressive strength in the direction of a force acting on the piezoelectric element of at least 30%, preferably over 90%, of the compressive strength of the piezoelectric element.

Surprisingly, it has been recognized that the required material properties for the transition element (low modulus of elasticity combined with high compressive strength) are fulfilled by a sintered material consisting largely (approx. 50% to 70%) of sintered hexagonal boron nitride (source of supply: e.g.: HENZE Boron Nitride Products, see: www.henze-bnp.de).

The transition element made of boron nitride can be used in the piezoelectric device with its specific electrical resistance>$10^{12}$ ohm cm simultaneously as an electrical insulating element.

For example, for $GaPO_4$ and a BN sinter material for the anisotropic modulus of elasticity [GPa]

$$E^{GaPO_4} = \begin{bmatrix} 67 & & \\ & 67 & \\ & & 102 \end{bmatrix} E^{BN} = \begin{bmatrix} 45 & & \\ & 45 & \\ & & 30 \end{bmatrix}$$

The modulus of elasticity of a transition element made of sintered hexagonal boron nitride, silicon carbide and zirconium(IV) oxide is between 30 GPa and 45 GPa at a compressive strength of more than 100 MPa. The modulus of elasticity of $GaPO_4$ is much higher in the support plane, namely 67 GPa in the y-axis and over 100 GPa in the z-axis, so that the $GaPO_4$ crystal can compress or stretch the transition element without breaking. The application temperature of the sintered material ranges up to 900° C. in oxidizing atmospheres and up to 1800° C. in inert atmospheres. It is therefore ideally suited for piezoelectric devices (e.g. for pressure sensors) in the high temperature range above 600° C., and in special applications up to over 800° C.

The transition element consists largely (approx. 50% to 70%) of sintered hexagonal boron nitride (hBN) and can contain proportions of silicon carbide (SiC), zirconium(IV) oxide ($ZrO_2$) and/or silicon oxide ($SiO_2$). Furthermore, boric oxide can be used as a binder, as well as traces of silicon and boric acid.

The transition element can be pre-tensioned together with the piezoelectric element to absorb shear forces normal to the direction of pretension.

Exemplary information on suitable materials for the transition element:
1) Sintered body of approx. 70% hBN, approx. 20% $ZrO_2$, approx. 10% SiC including traces of Si and boric acid.
2) Sintered body of approx. 50% hBN, approx. 43% $ZrO_2$, approx. 7% SiC including traces of Si and boric acid.
3) Sintered body of approx. 60% hBN, approx. 40% $SiO_2$ including traces of boric acid.

It is also possible to orient a transition element with an anisotropic modulus of elasticity (for example hexagonal boron nitride with an anisotropic modulus of elasticity) in such a way that the anisotropic thermal expansion of the piezoelectric element in its support plane is optimally compensated.

The piezoelectric element can be made of $GaPO_4$, langasite, langatate or tourmaline, for example, or of a piezoceramic, such as bismuth titanate.

BRIEF DESCRIPTION OF THE DRAWINGS

The invention is explained in more detail in the following by means of embodiment examples, wherein.

Parts with identical functions are marked with the same reference numerals in the embodiment variants.

DETAILED DESCRIPTION

Figure 1:
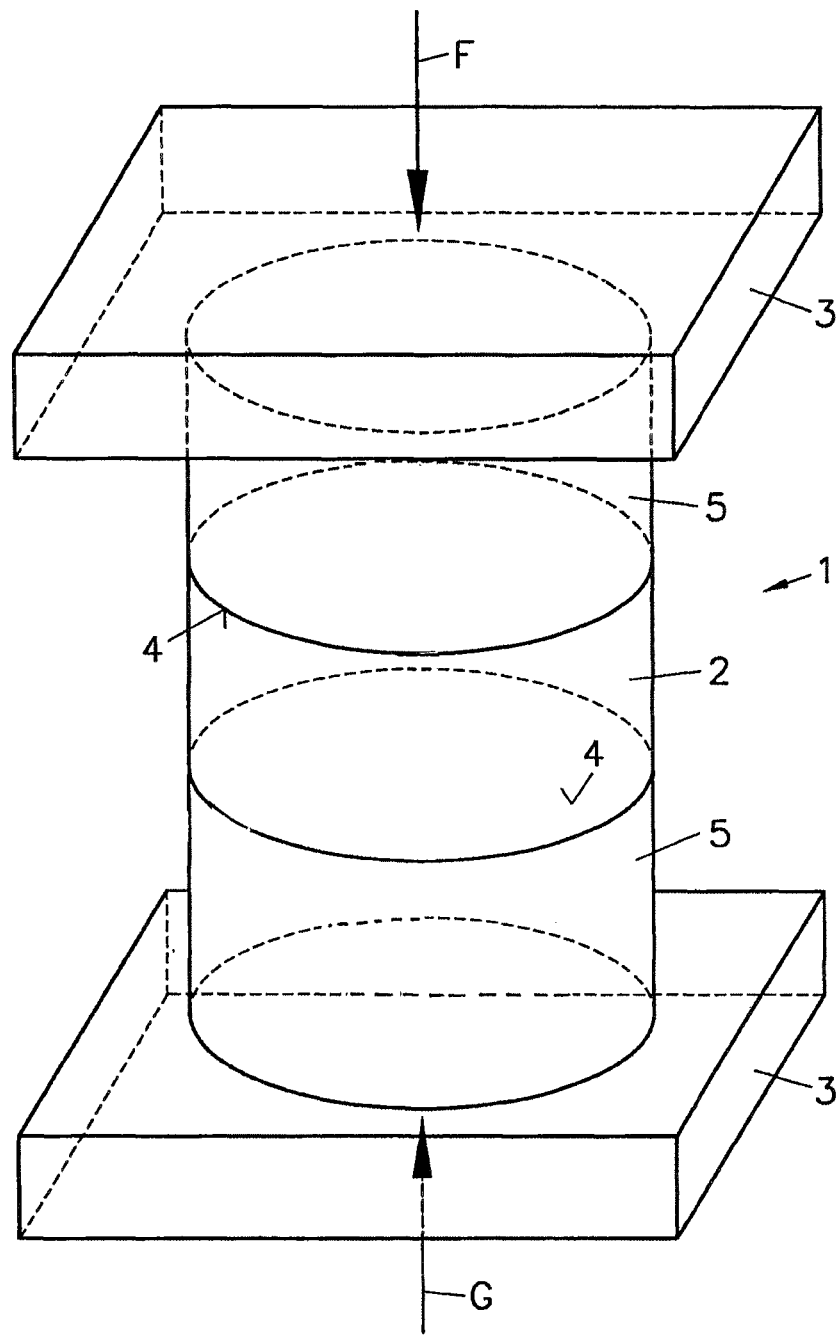
FIG. 1 shows a piezoelectric device according to the invention in a schematic, three-dimensional representation.

The piezoelectric device 1 schematically shown in FIG. 1 has at least one piezoelectric element 2, for example a crystal element made of $GaPO_4$, which has an anisotropic thermal expansion in its parallel support planes 4 aligned with the two force introduction elements 3, such that expansion differences between the piezoelectric element 2 and the force introduction elements 3 occur in the support planes 4 when the piezoelectric device 1 is thermally loaded. In order to minimize or compensate for shear forces and shear stresses that occur when the device 1 is heated or cooled, a transition element 5 is arranged between the piezoelectric element 2 and the force introduction elements 3, whose modulus of elasticity is smaller than the modulus of elasticity of the piezoelectric element 2 in its support plane 4. Shear stresses in the piezoelectric element 2 are thus reduced by expansion or compression of the transition element 5 and do not reach values that can lead to damage to the piezoelectric element 2. F is the force acting on the upper force introduction element 3 and G is the counter force resulting from the lower force introduction element 3 (for example a support or housing part).

Figure 2:
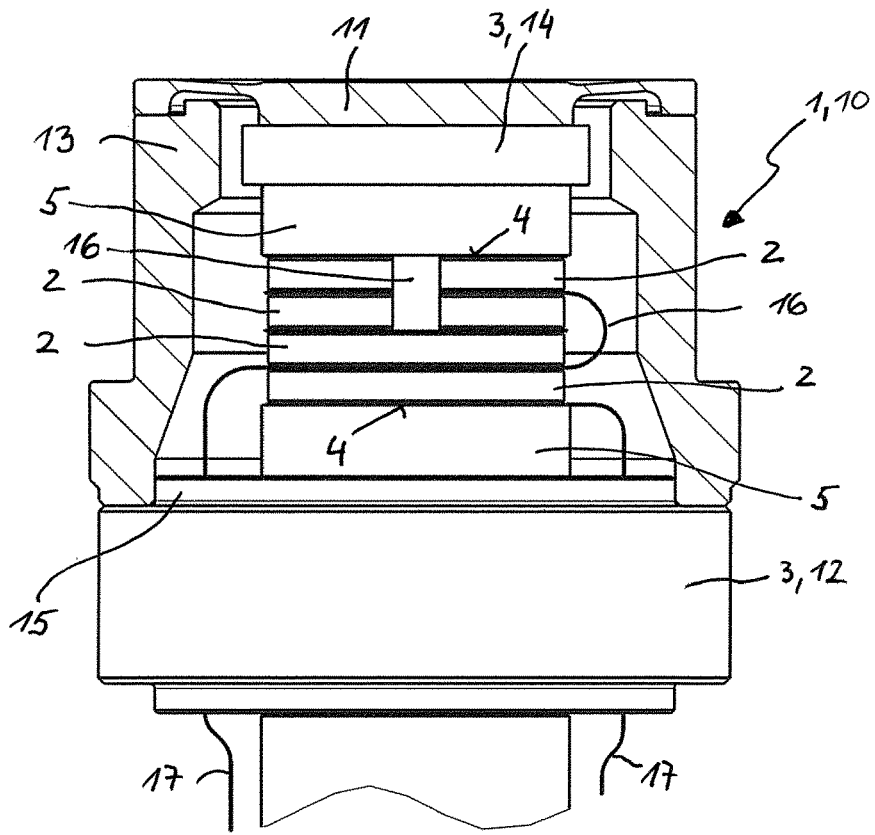
FIG. 2 shows a first embodiment variant of the invention based on a pressure sensor (longitudinal piezoelectric effect) in a partial sectional view.

The embodiment variant of the invention shown in FIG. 2 shows a pressure sensor 10 with a sensor membrane 11, wherein the lower force introduction element 3 is designed as a support 12 of the sensor 10. The upper force introduction element 3 is designed as a thrust piece 14 acted upon by the sensor membrane 11, wherein between the support 12 and the lower piezoelectric element 2 of a stack of e.g. four piezoelectric elements 2 a first, disc-shaped transition element 5 and between the upper, membrane-side piezoelectric element 2 and the thrust piece 14 a second, disc-shaped transition element 5 is arranged, so that the shear stresses and shear forces occurring in the critical support planes 4 of the edge-side piezoelectric elements 2 can be effectively compensated. The central area of the membrane 11 can also lie directly against the membrane-side transition element 5.

The diameter of the transition element essentially corresponds to the diameter of the piezoelectric elements, which in the variant shown according to FIG. 2 are arranged in a stack using the longitudinal piezoelectric effect. Depending on the application, the thickness of the transition element 5 can be between 20% and 500%, preferably between 50% and 300%, of the thickness of the piezoelectric element 2. In any case, a thin coating of the piezoelectric elements 2, for example of boron nitride, is not suitable to compensate for the shear forces described above.

The housing of the pressure sensor 10 is welded to the edge of the sensor membrane 11 and fixed to a centering flange 15 of the support 14.

Figure 3:
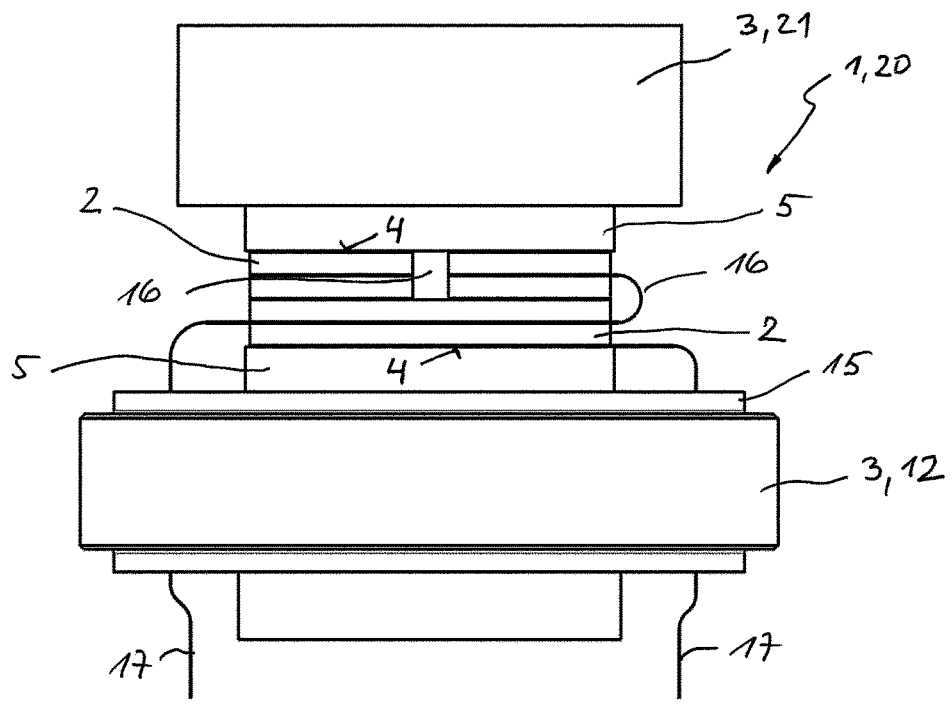
FIG. 3 shows a second embodiment variant of the invention based on a force or acceleration sensor in a lateral view.

The transition elements 5 also serve as electrical insulating elements. Charges of the same name on the piezoelectric elements are collected from a foil material via thin, ductile electrode plates 16 and dissipated by means of signal lines 17. In FIG. 2 and FIG. 3 only the connecting loops of the electrode plates 16 are visible.

The embodiment variant of the invention shown in FIG. 3 shows a force or acceleration sensor 20, wherein the lower force introduction element 3 is designed as support 12 of the sensor 20. The upper force introduction element 3 is designed as a seismic mass 21, wherein a first transition element 5 is arranged between the support 12 and the lower piezoelectric element 2 of a stack of, for example, four piezoelectric elements 2 and a second transition element 5 is arranged between the upper piezoelectric element 2 and the seismic mass 21, so that the shear stresses and shear forces occurring in the critical support planes 4 of the edge-side piezoelectric elements 2 can also be effectively compensated here. The two transition elements 5 and the piezoelectric elements 2 arranged between them are of annular design to accommodate a pretensioning element (not shown) acting on the support 12 and on the seismic mass 21.

Figure 4:
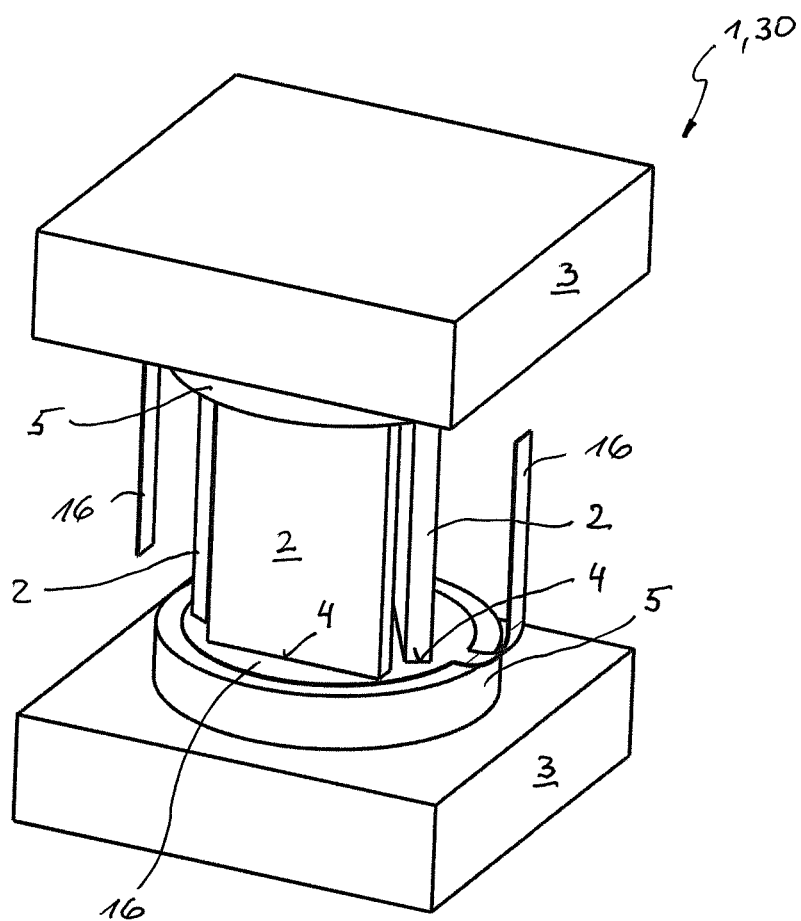
FIG. 4 shows a third embodiment variant of the invention based on a pressure sensor (transverse piezo effect) in a partial sectional view.

The embodiment variant of a pressure sensor 30 shown in FIG. 4 essentially corresponds to the variant shown in FIG. 2, wherein here the piezoelectric elements 2 are cuboidal in shape and arranged vertically using the transverse piezoelectric effect. The sensor housing and the sensor membrane have been omitted for a better overview. The thickness of the transition element 5 is between 5% and 200%, preferably between 10% and 50%, of the height of the piezoelectric element 2.

Figure 5:
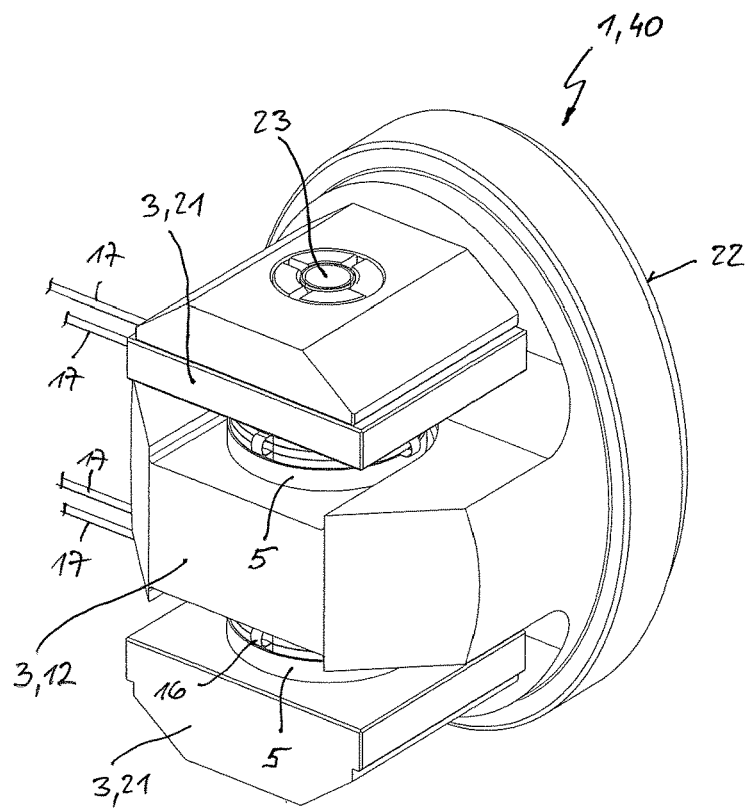
FIG. 5 shows a fourth embodiment variant of the invention based on an acceleration or vibration sensor in a three-dimensional representation.
Figure 6:
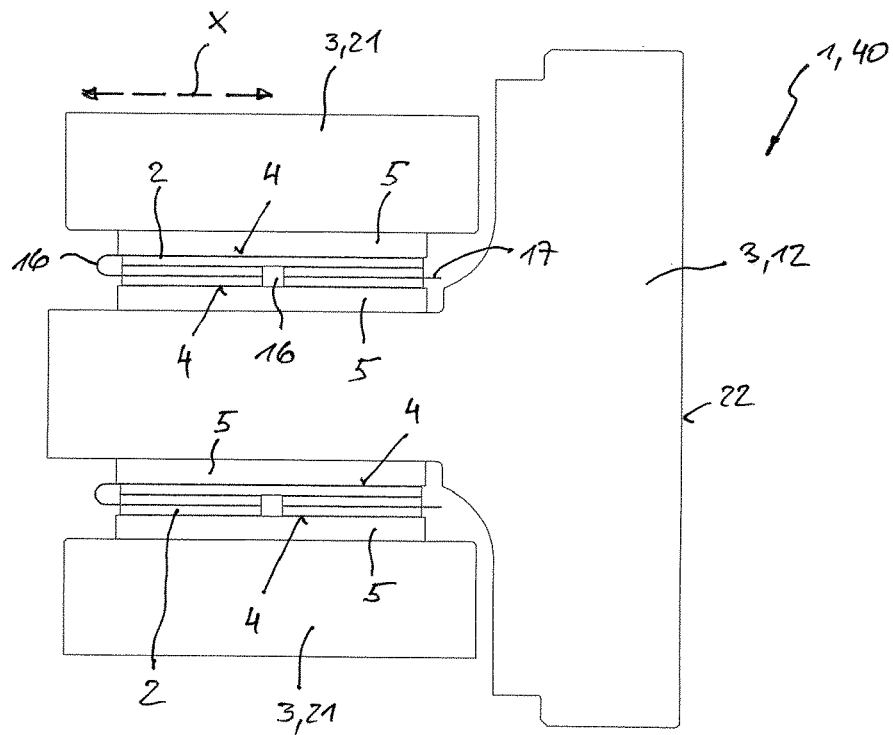
FIG. 6 shows a simplified side view of the fourth embodiment variant.

The embodiment variant of the invention shown in FIG. 5 and FIG. 6 shows a force or acceleration sensor 40, wherein a central, for example T-shaped force introduction element 3 is designed as a support 12 of the sensor 40 and has a mounting surface 22 for attachment to a component not further shown here. Two laterally arranged force introduction elements 3 are designed as seismic masses 21, wherein a stack with piezoelectric elements 2 is arranged in each case between each seismic mass 21 and the support 12 and the outer piezoelectric elements 2 of each stack rest on the support 12 or on the seismic masses 21 with the interposition of a transition element 5. The four transition elements 5 and the piezoelectric elements 2 arranged between them are, for example, of annular design to accommodate a prestressing element 23 acting on the support 12 and the two seismic masses 21. The device is suitable, for example, for recording shear and vibration forces that occur in the measuring direction x and introduce a shear load into the transition elements 5 (see FIG. 6).

The electrical contact is made via thin electrode plates 16 made of a foil material.

The invention claimed is:

1. A piezoelectric device comprising:
   at least one piezoelectric element,
   a force introduction element,
   a support plane aligned with the force introduction element, wherein expansion differences occur between the at least one piezoelectric element and the force introduction element in the support plane when the at least one piezoelectric device is thermally loaded, and
   at least one transition element is arranged between the at least one piezoelectric element and the force introduction element,
   wherein the at least one transition element has a modulus of elasticity whose modulus of elasticity components $c_{22}$ and $c_{33}$ in the support plane are smaller in each case than respective modulus of elasticity components of the piezoelectric element.

2. The piezoelectric device according to claim 1, wherein the at least one piezoelectric element has an anisotropic thermal expansion and an anisotropic modulus of elasticity which can be described by an elasticity tensor, wherein the modulus of elasticity of the at least one transition element is smaller than the components of the elasticity tensor associated with the support plane.

3. The piezoelectric device according to claim 2, wherein the at least one transition element has an anisotropic modulus of elasticity and is oriented in such a way that the anisotropic thermal expansion of the at least one piezoelectric element is optimally compensated in its support plane.

4. The piezoelectric device according to claim 1, wherein the at least one transition element has a compressive strength in a direction of a force acting on the at least one piezoelectric element of at least 30% of the compressive strength of the at least one piezoelectric element.

5. The piezoelectric device according to claim 4, wherein the at least one transition element has a compressive strength in the direction of a force acting on the at least one piezoelectric element of more than 90% of the compressive strength of the at least one piezoelectric element.

6. The piezoelectric device according to claim 1, wherein the at least one transition element together with the at least one piezoelectric element is pretensioned to absorb shear forces.

7. The piezoelectric device according to claim 1, wherein the at least one transition element consists largely of sintered hexagonal boron nitride.

8. The piezoelectric device according to claim 7, wherein the at least one transition element contains one or more of the following: silicon carbide (SiC), zirconium(IV) oxide (ZrO2) and silicon oxide (SiO2).

9. The piezoelectric device according to claim 7, wherein the at least one transition element contains boron oxide as a binder.

10. The piezoelectric device according to claim 1, wherein the at least one piezoelectric element consists of: GaPO4, langasite, langatate or tourmaline.

11. The piezoelectric device according to claim 1, wherein the at least one piezoelectric element consists of a piezoceramic.

12. The piezoelectric device according to claim 11, wherein the at least one piezoelectric element consists of bismuth titanate.

13. The piezoelectric device according to claim 1, wherein the thickness of the at least one transition element in a measuring arrangement for utilizing the longitudinal piezoelectric effect is between 20% and 500% of the thickness of the at least one piezoelectric element.

14. The piezoelectric device according to claim 13, wherein the thickness of the at least one transition element in a measuring arrangement for utilizing the longitudinal piezoelectric effect is between 50% and 300% of the thickness of the piezoelectric element.

15. The piezoelectric device according to claim 1, wherein the thickness of the at least one transition element in a measuring arrangement for utilizing the transverse piezoelectric effect is between 5% and 200% of the height of the at least one piezoelectric element.

16. The piezoelectric device according to claim 15, wherein the thickness of the at least one transition element in a measuring arrangement for utilizing the transverse piezoelectric effect is between 10% and 50% of the height of the at least one piezoelectric element.

17. The piezoelectric device according to claim 1, wherein the at least one piezoelectric device is a pressure sensor having a support, a piezoelectric element, a sensor membrane and a thrust piece acted upon by the sensor membrane, wherein a first transition element of the at least one transition element is arranged between the support and the at least one piezoelectric element and a second transition element of the at least one transition element is arranged between the at least one piezoelectric element and the thrust piece.

18. Piezoelectric device according to claim 1, wherein the piezoelectric device is a force or acceleration sensor having a support, a piezoelectric element and a seismic mass, wherein a first transition element of the at least one transition element is arranged between the support and the at least one piezoelectric element and a second transition element of the at least one transition element is arranged between the at least one piezoelectric element and the seismic mass.

19. The piezoelectric device according to claim 1, wherein the at least one transition element is an electrical insulating element.

\* \* \* \* \*